(12) United States Patent
Liu et al.

(10) Patent No.: US 11,621,375 B2
(45) Date of Patent: Apr. 4, 2023

(54) LIGHT-EMITTING DIODE CHIP AND METHOD OF MANUFACTURING THE SAME

(71) Applicant: Xiamen Changelight Co., Ltd., Fujian (CN)

(72) Inventors: Yingce Liu, Fujian (CN); Bin Song, Fujian (CN); Junxian Li, Fujian (CN); Qilong Wu, Fujian (CN); Yang Wang, Fujian (CN); Kaixuan Chen, Fujian (CN); Zhendong Wei, Fujian (CN); Xingen Wu, Fujian (CN); Hongyi Zhou, Fujian (CN); Lihe Cai, Fujian (CN); Xinmao Huang, Fujian (CN); Zhiwei Lin, Fujian (CN); Yongtong Li, Fujian (CN); Qimeng Lyu, Fujian (CN); Hexun Cai, Fujian (CN); Gengcheng Li, Fujian (CN)

(73) Assignee: Xiamen Changelight Co., Ltd., Fujian (CN)

( * ) Notice: Subject to any disclaimer, the term of this patent is extended or adjusted under 35 U.S.C. 154(b) by 0 days.

(21) Appl. No.: 16/472,187

(22) PCT Filed: Oct. 7, 2017

(86) PCT No.: PCT/IB2017/056202
§ 371 (c)(1),
(2) Date: Jun. 20, 2019

(87) PCT Pub. No.: WO2018/178754
PCT Pub. Date: Oct. 4, 2018

(65) Prior Publication Data
US 2020/0020830 A1    Jan. 16, 2020

(30) Foreign Application Priority Data
Oct. 7, 2017  (CN) .......................... 201710213823.6

(51) Int. Cl.
| H01L 33/44 | (2010.01) |
| H01L 33/38 | (2010.01) |
| H01L 33/06 | (2010.01) |

(52) U.S. Cl.
CPC .............. *H01L 33/44* (2013.01); *H01L 33/38* (2013.01); *H01L 33/06* (2013.01); *H01L 2933/0016* (2013.01); *H01L 2933/0025* (2013.01)

(58) Field of Classification Search
CPC ......... H01L 33/38; H01L 33/44; H01L 33/06; H01L 33/145; H01L 33/005; H01L 33/36; H01L 2933/0016; H01L 2933/0025
See application file for complete search history.

(56) References Cited

U.S. PATENT DOCUMENTS

| 7,282,745 | B2 * | 10/2007 | Yamaguchi | B82Y 20/00 |
| | | | | 257/13 |
| 10,074,773 | B2 * | 9/2018 | Sim | H01L 21/02502 |
| 2004/0012030 | A1 * | 1/2004 | Chen | H01L 33/38 |
| | | | | 257/99 |

FOREIGN PATENT DOCUMENTS

| CN | 102637799 A | | 8/2012 |
| CN | 104409617 A | * | 3/2015 |

(Continued)

OTHER PUBLICATIONS

International Search Report and Written Opinion for PCT Application No. PCT/IB2017/056202 dated Feb. 22, 2018, 9 pages.

(Continued)

*Primary Examiner* — Dale E Page
*Assistant Examiner* — Quovaunda Jefferson
(74) *Attorney, Agent, or Firm* — Arch & Lake LLP

(57) ABSTRACT

A light-emitting diode (LED) chip (2) comprises a substrate (20), an epitaxial structure (21), a transparent conductive layer (22), a passivation protective layer (23), and at least (Continued)

one electrode (25). The epitaxial structure (21) is disposed on the substrate (20). The transparent conductive layer (22) is disposed on the epitaxial structure (21). The transparent conductive layer (22) defines one or more first through holes (220) that extend through the transparent conductive layer (22). The passivation protective layer (23) is disposed on the transparent conductive layer (22). The passivation protective layer (23) defines one or more second through holes (230) that extend through the passivation protective layer (23). The electrode (25) is disposed on the passivation protective layer (23). The electrode (25) electrically connects the transparent conductive layer (11) through the one or more second through holes (230).

17 Claims, 8 Drawing Sheets

(56) References Cited

FOREIGN PATENT DOCUMENTS

| | | |
|---|---|---|
| CN | 104659177 A | 5/2015 |
| CN | 105374909 A | 3/2016 |
| CN | 105895764 A | 8/2016 |

OTHER PUBLICATIONS

International Preliminary Report on Patentability issued in PCT Application No. PCT/IB2017/056202 dated Oct. 10, 2019, 5 pages.

\* cited by examiner

LIGHT-EMITTING DIODE CHIP AND METHOD OF MANUFACTURING THE SAME

CROSS-REFERENCE TO RELATED APPLICATIONS

This application is a National Stage Entry of International Application No. PCT/IB2017/056202, filed Oct. 7, 2017, which claims priority to Chinese Patent Application 201710213823.6, filed Apr. 1, 2017, which is incorporated herein by reference in its entirety.

BACKGROUND

Light-emitting diodes (LEDs) are used as semiconductor light sources. Because of various advantages such as high brightness, long product life, small footprint and low power consumption, LEDs are considered to be the choice of the illumination devices of the next generation. However, luminous efficacies of the LED chips are still relatively low. A goal for research and development in the LED field is to improve the luminous efficacies of the LEDs.

SUMMARY

In an aspect according to some embodiments of the present disclosure, a light-emitting diode (LED) chip comprises a substrate, an epitaxial structure, a transparent conductive layer, a passivation protective layer, and at least one electrode. The epitaxial structure is disposed on the substrate. The transparent conductive layer is disposed on the epitaxial structure. The transparent conductive layer defines one or more first through holes that extend through the transparent conductive layer. The passivation protective layer is disposed on the transparent conductive layer. The passivation protective layer defines one or more second through holes that extend through the passivation protective layer. The electrode is disposed on the passivation protective layer. The electrode electrically connects the transparent conductive layer through the one or more second through holes.

In another aspect according to some embodiments of the present disclosure, a method of manufacturing a light-emitting diode (LED) chip comprises: disposing an epitaxial structure on a substrate; disposing a transparent conductive layer on the epitaxial structure, the transparent conductive layer defining one or more first through holes that extend through the transparent conductive layer; disposing a passivation protective layer on the transparent conductive layer, the passivation protective layer defining one or more second through holes that extend through the passivation protective layer; and disposing at least one electrode on the passivation protective layer, the electrode electrically connecting the transparent conductive layer through the one or more second through holes.

In another aspect according to some embodiments of the present disclosure, a semiconductor device comprises a substrate, an epitaxial structure, a transparent conductive layer, a passivation protective layer, and at least one electrode. The epitaxial structure is disposed on the substrate. The epitaxial structure includes a first semiconductor layer, a quantum well luminescent layer, and a second semiconductor layer successively disposed on the substrate. The transparent conductive layer is disposed on the epitaxial structure. The transparent conductive layer defines one or more first through holes that extend through the transparent conductive layer. The passivation protective layer is disposed on the transparent conductive layer. The passivation protective layer includes a portion that fills in the first through holes of the transparent conductive layer. The passivation protective layer defines one or more second through holes that extend through the passivation protective layer. Along a direction perpendicular to substrate, projections of the first through holes do not overlap with projections of the second through holes. The electrode is disposed on the passivation protective layer. The electrode electrically connects the second semiconductor layer through the one or more second through holes and the transparent conductive layer.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Figure 1:
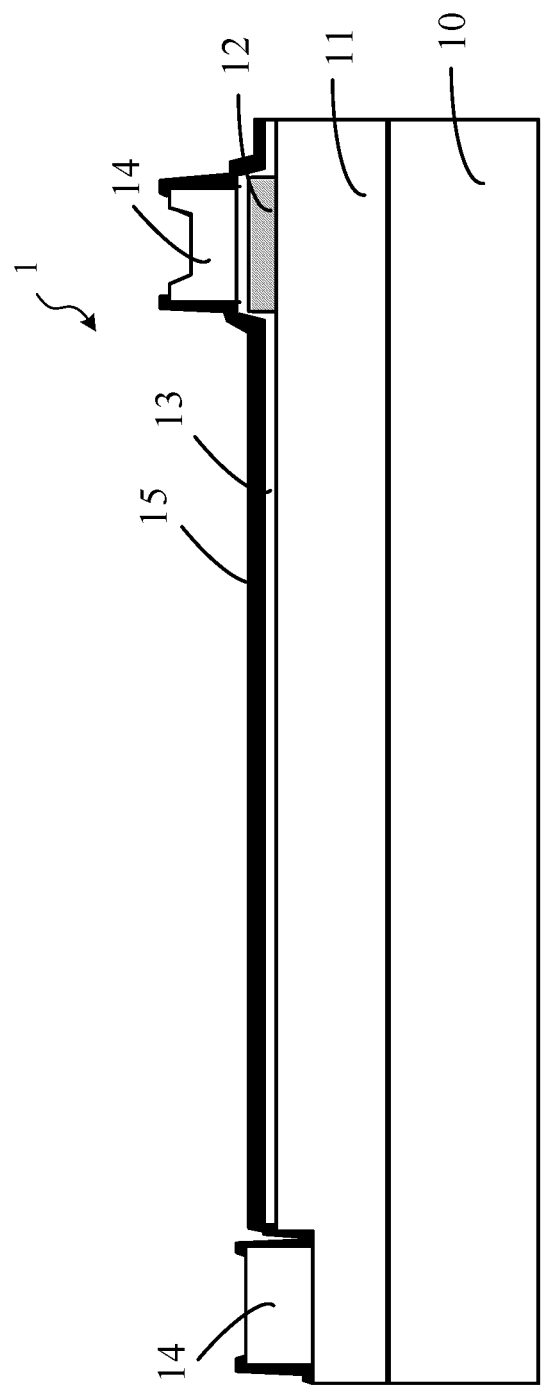
FIG. 1 schematically illustrates a cross-sectional view of an LED chip, according to various embodiments of the present disclosure.

In some embodiments, in order to improve the luminous efficacy, a LED chip may include a current blocking layer. As illustrated in FIG. 1, an LED chip 1 includes a substrate 10, an epitaxial structure 11 disposed on the substrate 10, a current blocking layer 12 disposed on the epitaxial structure 11, a transparent conductive layer 13, one or more metal electrodes 14, and a passivation protective layer 15. The current blocking layer 12 is disposed under the transparent conductive layer 13 and at least one of the metal electrodes 14. The current blocking layer 12, which includes an insulative material, prevents the electrons and holes from being recombined underneath the metal electrode 14. As a result, more current is flowed through the metal electrode 14 and the luminous efficacy of the LED chip 1 may be improved. However, the insertion of the layer of the current blocking layer 12 in the LED chip 1 increases the manufacturing cost of the LED chip 1. For example, an extra etching process is performed to form the current blocking layer 12 during the manufacturing process.

Figure 2:
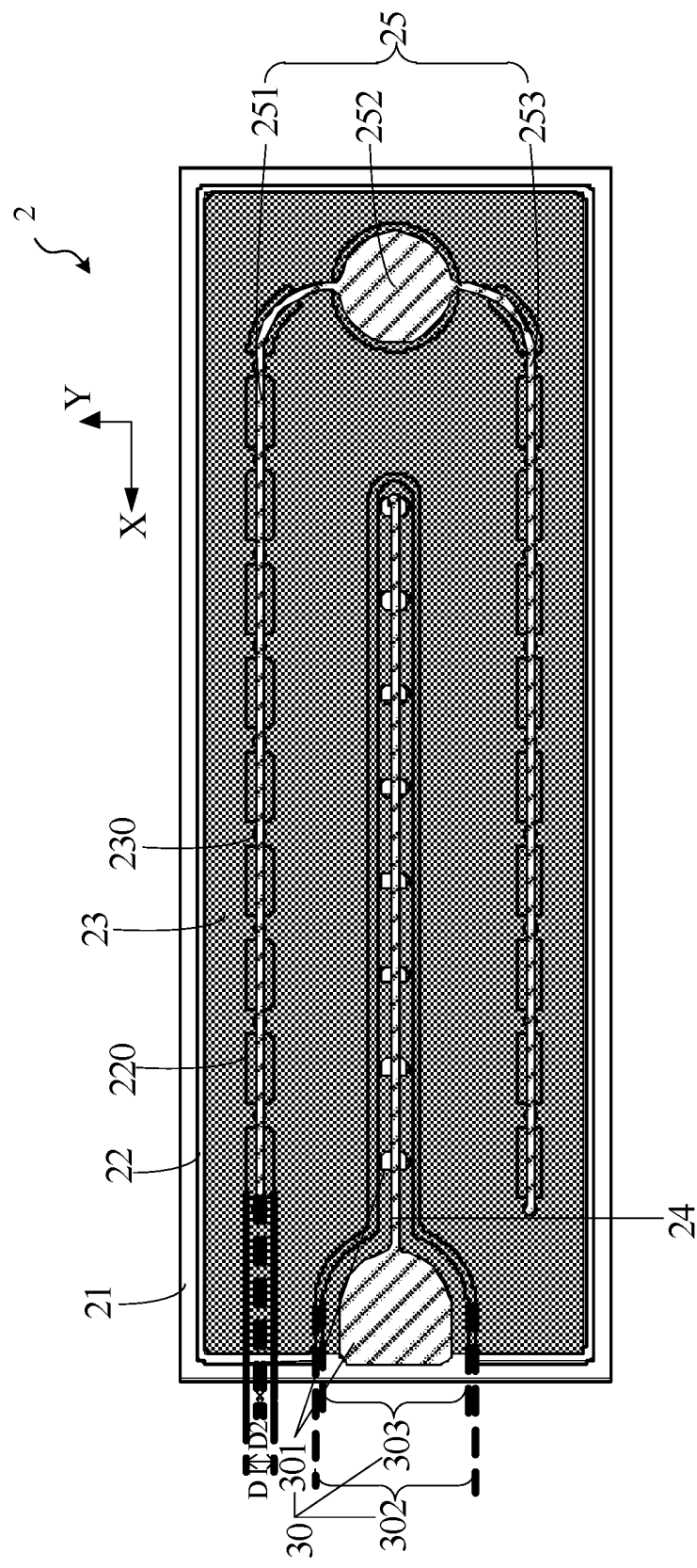
FIG. 2 schematically illustrates a top view of an LED chip, according to various embodiments of the present disclosure.
Figure 3:
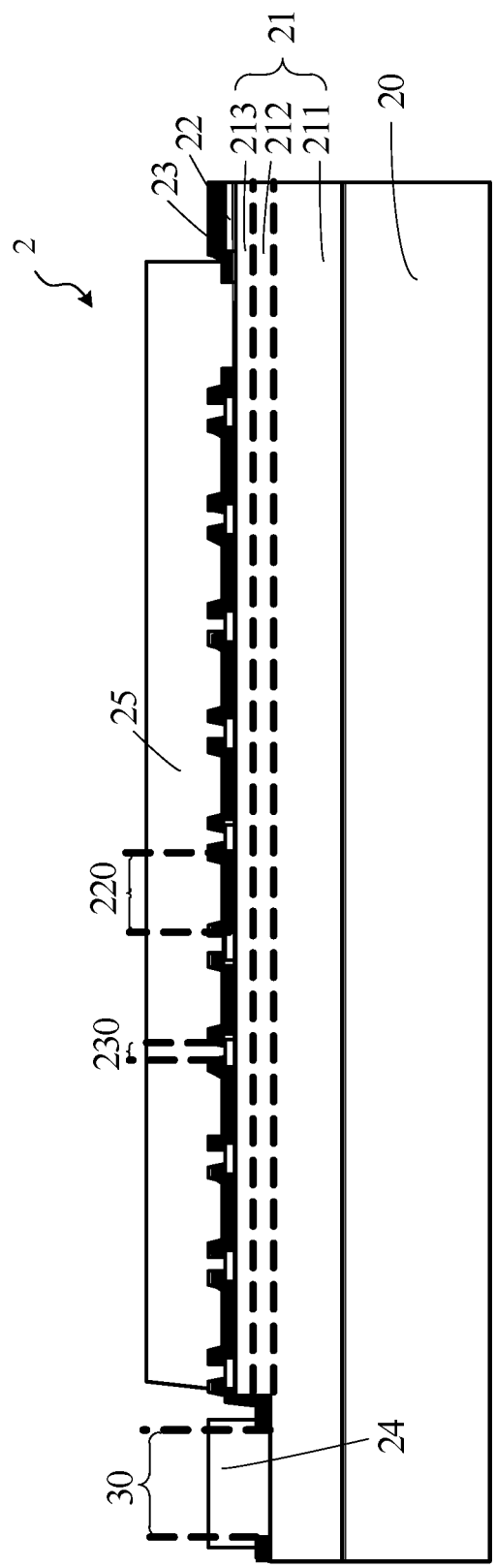
FIG. 3 schematically illustrates a cross-sectional view of the LED chip of FIG. 2, according to various embodiments of the present disclosure.

At least some embodiments of the present disclosure describe an LED chip having an improved luminous efficacy, without a dedicated current blocking layer. The manufacturing cost of the LED chip is low because less etching processes are specified. FIGS. 2 and 3 schematically illustrate a top view and a cross-sectional view of the LED chip 2, according to various embodiments of the present disclosure. The LED chip 2 includes, but not limited to, a substrate 20, an epitaxial structure 21, a transparent conductive layer 22, a passivation protective layer 23, a first electrode 24 and a second electrode 25. The epitaxial structure 21 is disposed on a surface (e.g., top surface) of the substrate 20. In some embodiments, the substrate 20 may be, e.g., a sapphire ($Al_2O_3$) substrate, a silicon (Si) substrate, a silicon carbide (SiC) substrate, or a combination of two or more thereof.

In some embodiments, the material of the transparent conductive layer 22 may include at least one oxide material that has a high light transmittance (e.g., transparent), a high electrical conductivity, and a low contact resistance, such as indium tin oxide (ITO), zirconium oxide, cadmium oxide, other suitable material, or a combination of two or more thereof. In some embodiments, a height of the transparent conducive layer 22 may be from about 30 nanometers (nm) to about 110 nm. The material of the passivation protective layer 23 may include at least one inorganic material that is transparent and insulating, such as silicon oxide, silicon nitride, aluminum oxide, magnesium fluoride, other suitable material, or a combination of two or more thereof. In some embodiments, the reflective index of the passivation protective layer 23 may be from about 1.55 to about 1.9. In some embodiments, a height of the passivation protective layer 23 may be about from 70 nm to about 250 nm. In some alternative embodiments, instead of including transparent materials, the layer 22 and/or the layer 23 may include light-transmissive materials that are not transparent or partially transparent (e.g., translucent).

The epitaxial structure 21 may include a first semiconductor layer 211 disposed on the surface of the substrate 20, a quantum well luminescent layer 212 disposed on the first semiconductor layer 211, and a second semiconductor layer 213 disposed on the quantum well luminescent layer 212. The doping types of the first semiconductor layer 211 and the second semiconductor layer 213 may be opposite to each other. For example, in embodiments illustrated in FIGS. 2 and 3, the first semiconductor layer 211 may be an N-type semiconductor layer, while the second semiconductor layer 213 may be a P-type semiconductor layer. However, in some embodiments, the first semiconductor layer 211 and the second semiconductor layer 213 may be of various types. For example, the first semiconductor layer 211 may be a P-type semiconductor layer, while the second semiconductor layer 213 may be an N-type semiconductor layer.

In some embodiments, the LED chip 2 may further include other additional materials or layers, such as materials or layers for optimizing the N-type and P-type semiconductor layers. For example, between the substrate 20 and the second semiconductor layer 213, the LED chip 2 may further include layers such as buffer layer, un-doped first semiconductor layer, N-type doped first semiconductor layer, light-emitting active layer, and/or electron blocking layer. At least some of these layers help further optimizing the performance of the LED chip 2 and/or improving the luminous efficacy of the LED chip 2.

As illustrated in embodiments of FIGS. 2 and 3, the transparent conductive layer 22 is disposed on a surface of the second semiconductor layer 213, and defines at least one first through hole 220 that extends through the transparent conductive layer 22. The passivation protective layer 23 is disposed on a surface of the transparent conductive layer 22, and defines at least one second through hole 230 that extends through the passivation protective layer 23. The at least one first through hole 220 and the at least one second through hole 230 do not overlap along a direction perpendicular to the substrate 20 (e.g., a vertical direction as in FIG. 3).

Because the first through hole(s) 220 and the second through hole(s) 230 do not overlap along the direction, a portion of the passivation protective layer 23 covers and fills in the first through hole(s) 220, and a portion of the transparent conductive layer 22 is exposed to and contacts the passivation protective layer 23 through the second through hole(s) 230.

In some embodiments as illustrated in FIGS. 2 and 3, at least one third through hole 30 extends through the passivation protective layer 23, the transparent conductive 22, the second semiconductor 213 and the quantum well luminescent layer 212. The first electrode 24 is disposed on at least a portion of the passivation protective layer 23. At least a portion of the first electrode 24 contacts and electrically connects the first semiconductor layer 211 of the epitaxial structure 21 through the third through hole 30.

The second electrode 25 is disposed on another portion of the passivation protective layer 23, and covers at least a portion of the first through hole(s) 220 and at least a portion of the second through hole(s) 230. The second electrode 25 contacts and electrically connects the transparent conductive 22 through the second through hole(s). The second electrode 25 further contacts and electrically connects the second semiconductor layer 213 through the one or more second through hole(s) 230 and the transparent conducive layer 22.

In some embodiments, if the first semiconductor layer 211 is an N-type semiconductor layer and the second semiconductor layer 213 is a P-type semiconductor layer, the first electrode 24 may be an N-type electrode and the second electrode 25 may be a P-type electrode. The materials of the first electrode 24 and the second electrode 25 may include metals, metal alloys, or other materials. The materials of the first electrode 24 and the second electrode 25 may be the same or different.

As shown in FIG. 3, the second electrode 25 covers the first through hole(s) 220 and the second through hole(s) 230, and the first through hole(s) 220 and the second through hole(s) 230 do not overlap along the direction perpendicular to the substrate 20. Thus, in an area corresponding to (e.g., occupied by) the first through hole(s) 220, a portion of the passivation protective layer 23 between the second electrode 25 and the second semiconductor layer 213 may serve to block currents or electrons, to replace a dedicated current blocking layer. Such an arrangement reduces the manufacturing cost of the LED chip 2, and improves the luminous efficacy of the LED chip 2. In addition, in an area corresponding to (e.g., occupied by) the second through hole(s) 230, the second electrode 25 may electrically connect the second semiconductor layer 213 through the second through hole(s) 230 and the portion of the transparent conductive layer 22 disposed in the through hole(s) 230. Thus, point-type light emitting may be achieved at the second through hole(s) 230, further increasing the brightness of the LED chip.

In some embodiments, to increase a contact area between the second electrode 25 and the transparent conductive 22 and to improve expansion effect of the lateral current, the transparent conductive layer 22 may define multiple first through holes 220, and the passivation protective layer 23 may define multiple second through holes 230. In some embodiments, multiple first through holes 220 and multiple second through holes 230 can be arranged in an alternating pattern. In other words, one of the first through holes 220 is located between adjacent two second through holes 230, and one of the second through holes 230 is located between adjacent two first through holes 220. Further, the second electrode 25 covers the alternating series of first through holes 220 and second through holes 230. Other arrangements are possible. For example, in some alternative embodiments, multiple second through holes 230 can be disposed between two adjacent first through holes 220, or multiple first through holes 220 can be disposed between two adjacent second through holes 230.

It is to be understood that the first through holes 220 and the second through holes 230 can have any suitable shapes. Here, the shape of a through hole refers to the shape of a cross section of the through hole. For example, the shape of the first through holes 220 can be square, circular, oval, etc. Similarly, the shape of the second through holes 230 can be square, circular, oval, etc. The shape of the first through holes 220 can be the same as, or different from, the shape of the second through holes 230. For example, as shown in FIG. 2, the shape of the first through holes 220 can be substantially square, and the shape of the second through holes 230 can be circular.

In some embodiments, the third through hole 30 may be a through hole formed by a single etching process. In some other embodiments, the third through hole 30 may be a through hole formed by multiple etching processes. For example, the third through hole 30 may be formed by three etching processes. In particular, the third through hole 30 may include a first sub-through hole 301, a second sub-through hole 302 and a third sub-through hole 303 that are in communication with each other. The first sub-through hole 301 extends through the passivation protective layer 23. The second sub-through hole 302 extends through the transparent conductive layer 22. The third sub-through hole 303 extends through the quantum well luminescent layer 212 and the second semiconductor layer 213.

The shapes of the first sub-through hole 301, the second sub-through hole 302 and the third sub-through hole 303 can be different, or the same, as long as the first sub-through hole 301, the second sub-through hole 302 and the third sub-through hole 303 are in communication with each other (e.g., interconnected). The first electrode 24 electrically connects the first semiconductor layer 211 through the interconnected sub-through holes 301, 302 and 303. Thus, after forming the epitaxial structure 21 on the substrate 20, the epitaxial structure 21 can be etched to form the third sub-through hole 303 that extends through the quantum well luminescent layer 212 and the second semiconductor layer 213. After forming the transparent conductive layer 22 on the surface of the epitaxial structure 21, the transparent conductive layer 22 can be etched to form the first through hole(s) 220 and the second sub-through hole 302 that extend through the transparent conductive layer 22. After forming the passivation protective layer 23 on the surface of the transparent conductive layer 22, the passivation protective layer 23 can be etched, to form the second through hole(s) 230 and the first sub-through hole 302 that extend through the passivation protective layer 23. The fabrication process of the LED chip is described in detail in the subsequent sections of the present disclosure.

In some embodiments, the etching process for the epitaxial structure 21 may be preferably a physical etching process (e.g., ion milling etching, reactive-ion etching, etc.), while the etching processes for the transparent conductive layer 22 and the passivation protective layer 23 may be preferably chemical etching processes (e.g., etching using photoresist and hydrogen fluoride). Further, after forming an electrode layer on the surface of the passivation protective layer 23, the electrode layer may be etched to form the first electrode 24 and the second electrode 25. In other words, in some embodiments, the LED chip can be fabricated using, e.g., four etching processes. The fabrication process is streamlined and does not specify an additional material and an additional etching process to form a dedicated current blocking layer. Such a fabrication process reduces the manufacturing cost of the LED chip and increases the luminous efficacy of the LED chip.

In some embodiments, along a direction perpendicular to the substrate 20 (e.g., the vertical direction of FIG. 2), a projection of the first sub-through hole 301 is within a projection of the third sub-through hole 303. Further, along the direction perpendicular to the substrate 20, a projection of the second sub-through hole 302 overlaps with the projection of the third sub-through hole 303. Alternatively, along the direction perpendicular to the substrate 20, the projection of the third sub-through hole 302 may be within the projection of the second sub-through hole 303.

As shown in FIG. 2, in some embodiments, the passivation protective layer 23 may include multiple first sub-through holes. The shape of the first sub-through holes 301 may be substantially circular. The shape of the third sub-through hole 303 may be elongated. Along the direction perpendicular to the substrate 20, projections of the first sub-through holes are within the projection of the third sub-through hole 303. The shape of the third sub-through hole 303 and the shape of the second sub-through hole 302 may be the same or similar. The shape of the third sub-through hole 303 and the shape of the second sub-through hole 302 may be the same as or similar to the shape of the first electrode 24, such that the first electrode 24 may have more contact area with the first semiconductor layer 211.

In some embodiments, as shown in FIG. 2, the second electrode 25 may have a U-shape, while the first electrode 24 may have an elongated shape (e.g., a linear shape). At least a portion of the first electrode 24 extends into the opening of the U-shape area defined by the second electrode 25.

It is to be understood that the through holes (and sub-through holes) that are located at the same layer but at different locations may have different sizes and shapes. The shapes and the sizes may be determined according to specifications of various embodiments.

In some embodiments, the first electrode 24 may electrically connect the first semiconductor layer 211 through the third through hole 30, while the first electrode 24 may be electrically isolated from the transparent conductive layer 22 by the passivation protective layer 23. Thus, the first electrode 24 and the second electrode 25 are not short-circuited through the transparent conductive layer 22. Further, the portion of the passivation protective layer 23 between the first electrode 24 and the first semiconductor layer 211 may also serve the functionality of blocking current, which further improves the luminous efficacy of the LED chip.

As shown in FIG. 2, the second electrode 25 may include at least a first sub-electrode 251, a second sub-electrode 252 and a third sub-electrode 253. The first sub-electrode 251 and the third sub-electrode 253 are linear electrodes, preferably linear electrodes that are not intersected with each other. The second sub-electrode 252 interconnects the first sub-electrode 251 and the third sub-electrode 253. The first sub-electrode 251 and the third sub-electrode 253 extend along an X-direction (which is perpendicular to a Y-direction) as shown in FIG. 2. In order to ensure the current blocking effect of the passivation protective layer 23, along the Y-direction, a width D1 of the first through hole(s) 220 is greater than a width D2 of the linear electrodes 251 and 253. For example, along the Y-direction (which is perpendicular to the X-direction along which the linear electrodes 251 and 253 extend), a difference between the width D1 of the first though hole(s) 220 and the width D2 of the linear electrodes 251 and 252 may be from about 1 micrometer to about 10 micrometers.

In some embodiments, the second electrode 25 may cover at least a portion of the first through hole(s) 220 and the second through hole(s) 230, and the first through hole(s) 220 and the second through hole(s) 230 do not overlap along the direction perpendicular to the substrate 20. Thus, in an area corresponding to (e.g., occupied by) the first through hole(s) 220, a portion of the passivation protective layer 23 between the second electrode 25 and the second semiconductor layer 213 may serve to block currents or electrons, to replace a dedicated current blocking layer. Such an arrangement reduces the manufacturing cost of the LED chip 2, and improves the luminous efficacy of the LED chip 2. In addition, in an area corresponding to (e.g., occupied by) the second through hole(s) 230, the second electrode 25 may electrically connect the second semiconductor layer 213 through the second through hole(s) 230 and the portion of the transparent conductive layer 22 disposed in the through hole(s) 230. Thus, point-type light emitting may be achieved at the second through hole(s) 230, further increasing the brightness of the LED chip.

Figure 4:
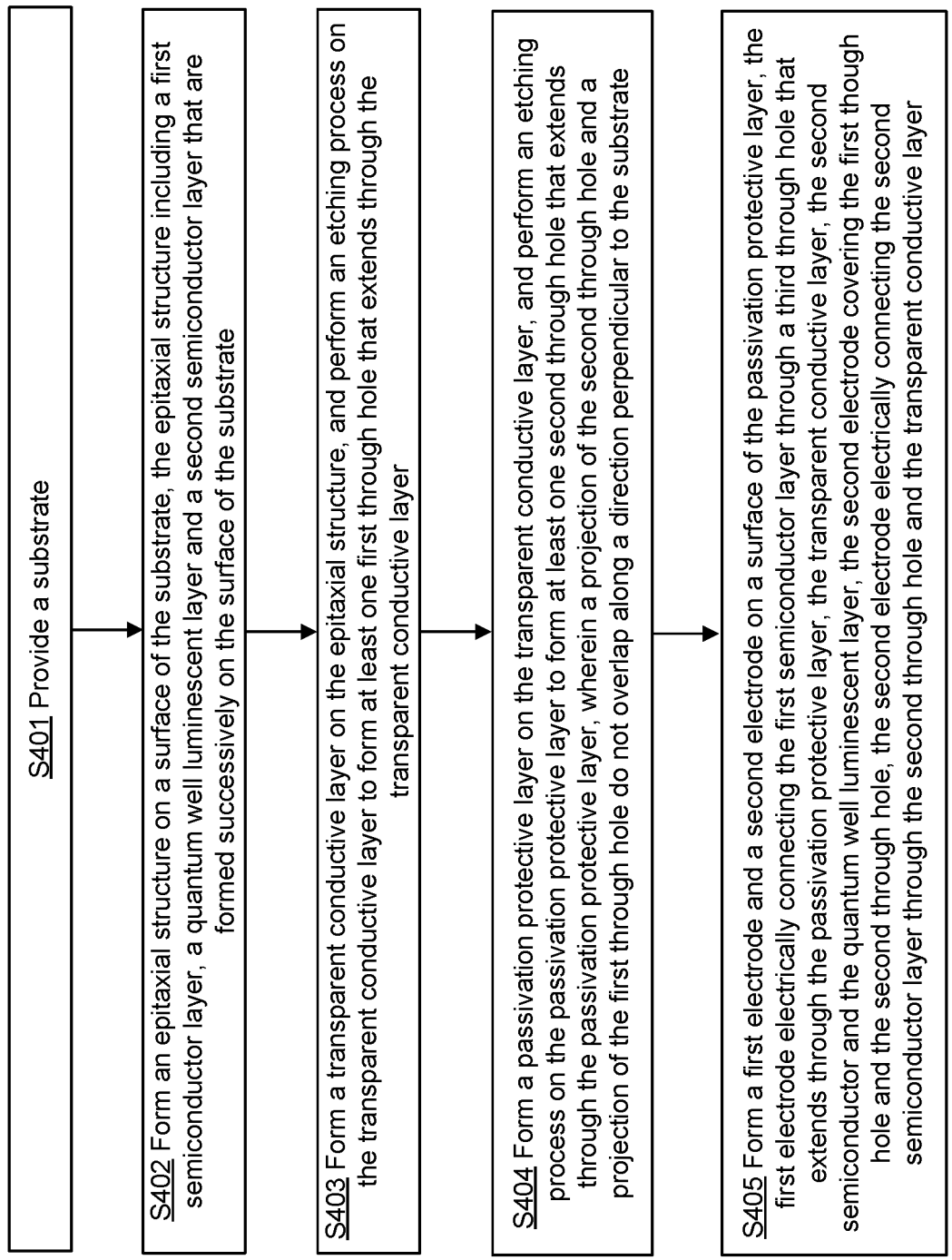
FIG. 4 schematically illustrates a flow chart of a method of manufacturing an LED chip, according to various embodiments of the present disclosure.

FIG. 4 illustrates a flow chart of a method of manufacturing an LED chip. At stage S401, a substrate is provided. At stage S402, the method forms an epitaxial structure on a surface of the substrate, the epitaxial structure including a first semiconductor layer, a quantum well luminescent layer and a second semiconductor layer that are formed successively on the surface of the substrate. The doping types of the first semiconductor layer 211 and the second semiconductor layer 213 may be opposite to each other.

At stage S403, the method forms a transparent conductive layer on the epitaxial structure, and performs an etching process on the transparent conductive layer to form at least one first through hole that extends through the transparent conductive layer. At stage S404, the method forms a passivation protective layer on the transparent conductive layer, and performs an etching process on the passivation protective layer to form at least one second through hole that extends through the passivation protective layer, wherein a projection of the second through hole and a projection of the first through hole do not overlap along a direction perpendicular to the substrate.

At stage S405, the method forms a first electrode and a second electrode on a surface of the passivation protective layer, the first electrode electrically connecting the first semiconductor layer through a third through hole that extends through the passivation protective layer, the transparent conductive layer, the second semiconductor and the quantum well luminescent layer, the second electrode covering the first though hole and the second through hole, the second electrode electrically connecting the second semiconductor layer through the second through hole and the transparent conductive layer.

In some embodiments, the first semiconductor layer 211 may be an N-type semiconductor layer, while the second semiconductor layer 213 may be a P-type semiconductor layer. However, in some embodiments, the first semiconductor layer 211 may be an N-type semiconductor layer, while the second semiconductor layer 213 may be a P-type semiconductor layer. However, in some embodiments, the first semiconductor layer 211 and the second semiconductor layer 213 may be of various types. For example, the first semiconductor layer 211 may be a P-type semiconductor layer, while the second semiconductor layer 213 may be an N-type semiconductor layer.

In some embodiments, the LED chip may further include other additional materials or layers, such as materials or layers for optimizing the N-type and P-type semiconductor layers. For example, between the substrate 20 and the second semiconductor layer 213, the LED chip may further include layers such as buffer layer, un-doped first semiconductor layer, N-type doped first semiconductor layer, light-emitting active layer, and/or electron blocking layer. At least some of these layers help further optimizing the performance of the LED chip 2 and/or improving the luminous efficacy of the LED chip 2.

In some embodiments, as shown in FIG. 2, the third through hole 30 may include a first sub-through hole 301, a second sub-through hole 302 and a third sub-through hole 303 that are in communication with each other. The first sub-through hole 301 extends through the passivation protective layer 23. The second sub-through hole 302 extends through the transparent conductive layer 22. The third sub-through hole 303 extends through the quantum well luminescent layer 212 and the second semiconductor layer 213.

After forming the epitaxial structure 21 on the substrate 20, the epitaxial structure 21 can be etched to form the third sub-through hole 303 that extends through the quantum well luminescent layer 212 and the second semiconductor layer 213. After forming the transparent conductive layer 22 on the surface of the epitaxial structure 21, the transparent conductive layer 22 can be etched to form the first through hole(s) 220 and the second sub-through hole 302 that extend through the transparent conductive layer 22. After forming the passivation protective layer 23 on the surface of the transparent conductive layer 22, the passivation protective layer 23 can be etched, to form the second through holes 230 and the first sub-through hole 302 that extend through the passivation protective layer 23.

Figure 5A:
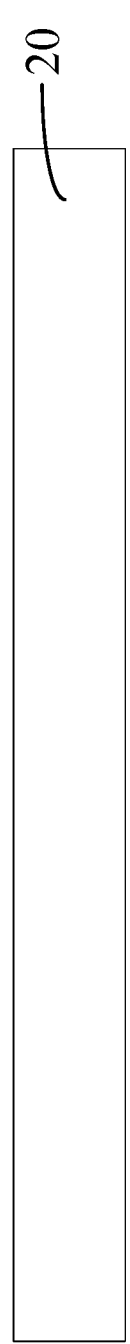
FIG. 5a schematically illustrates one or more stages of a method of manufacturing an LED chip, according to various embodiments of the present disclosure.

FIGS. 5a-5h illustrate various stages of a method of manufacturing an LED chip. In some embodiments, the third through hole of the LED chip may be formed through three etching processes as disclosed. As shown in FIG. 5a, a substrate 20 is provided. The substrate may be, e.g., a sapphire ($Al_2O_3$) substrate, a silicon (Si) substrate, a silicon carbide (SiC) substrate, or a combination of two or more thereof.

Figure 5B:
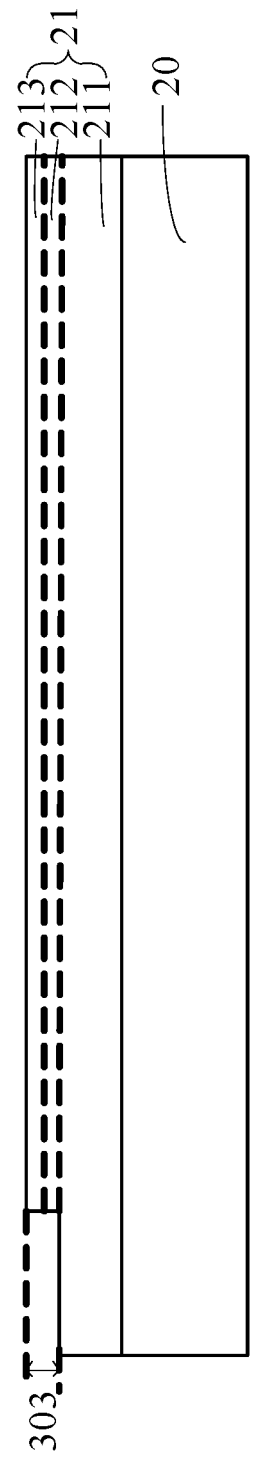
FIG. 5b schematically illustrates one or more stages of a method of manufacturing an LED chip, according to various embodiments of the present disclosure.

As shown in FIG. 5b, an epitaxial structure 21 is formed on a surface of the substrate 20. The epitaxial structure 21 includes at least a first semiconductor layer 211, a quantum well luminescent layer 212, and a second semiconductor layer 213 successively disposed on the surface of the substrate 20. Except an area to be covered by a first electrode 24, a mask is disposed to cover the remaining area on top of the second semiconductor 213. An etching process is performed to the area to be covered by the first electrode 24 (and not covered by the mask), to etch away portions of the first semiconductor layer 211 and the quantum well luminescent layer 212 corresponding to the area. As a result, a third through hole 303 is formed by the etching process.

Figure 5C:
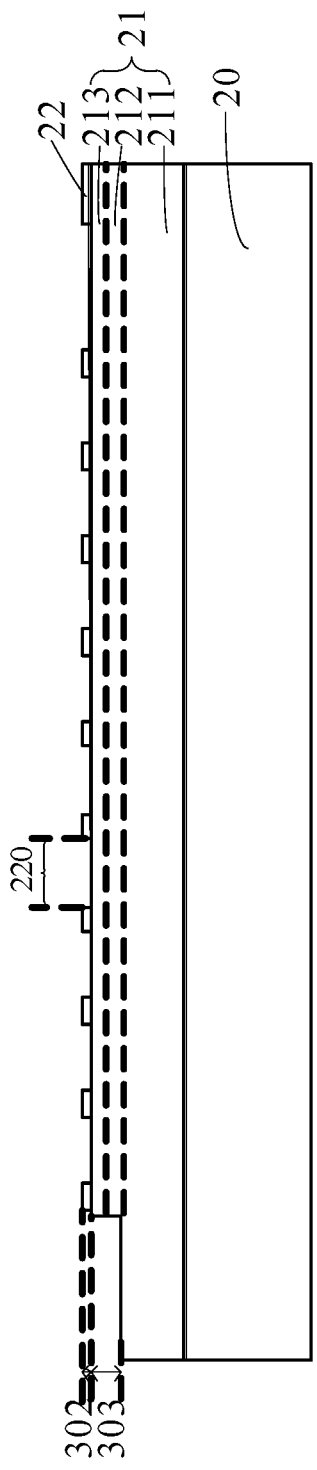
FIG. 5c schematically illustrates one or more stages of a method of manufacturing an LED chip, according to various embodiments of the present disclosure.
Figure 5D:
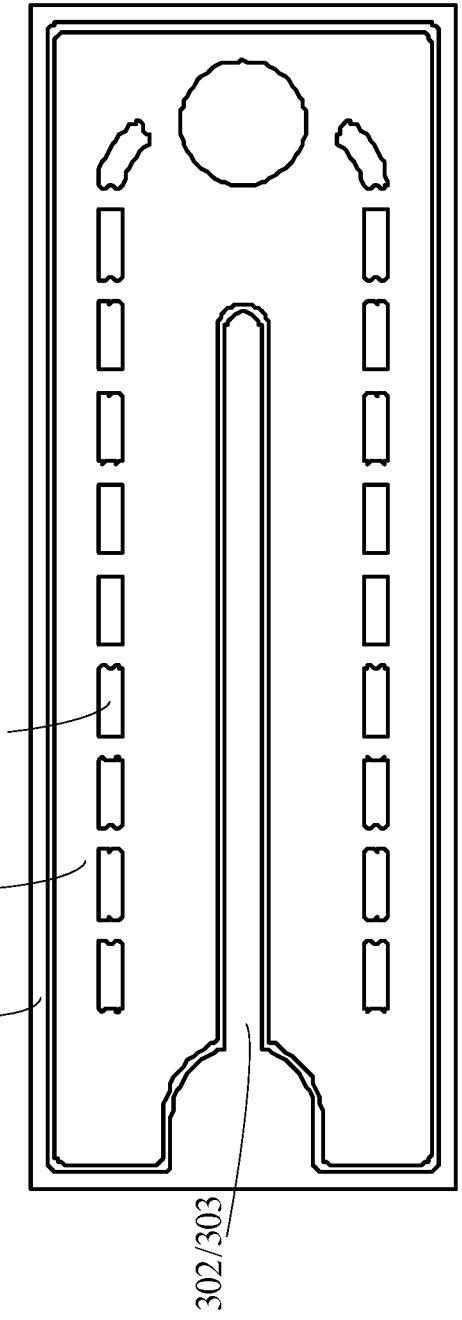
FIG. 5d schematically illustrates one or more stages of a method of manufacturing an LED chip, according to various embodiments of the present disclosure.

As shown in FIGS. 5c and 5d, a transparent conductive layer 22 is formed on a surface of the epitaxial structure 21. An etching process is performed to the transparent conductive layer 22 to form one or more first through hole(s) 220 and a second sub-through hole 302 that extend through the transparent conductive layer 22. The first through hole(s) 220 are located within an area corresponding to a second electrode 25 to be disposed. The second sub-through hole 302 is located at an area corresponding to a first electrode 24 to be disposed.

Figure 5E:
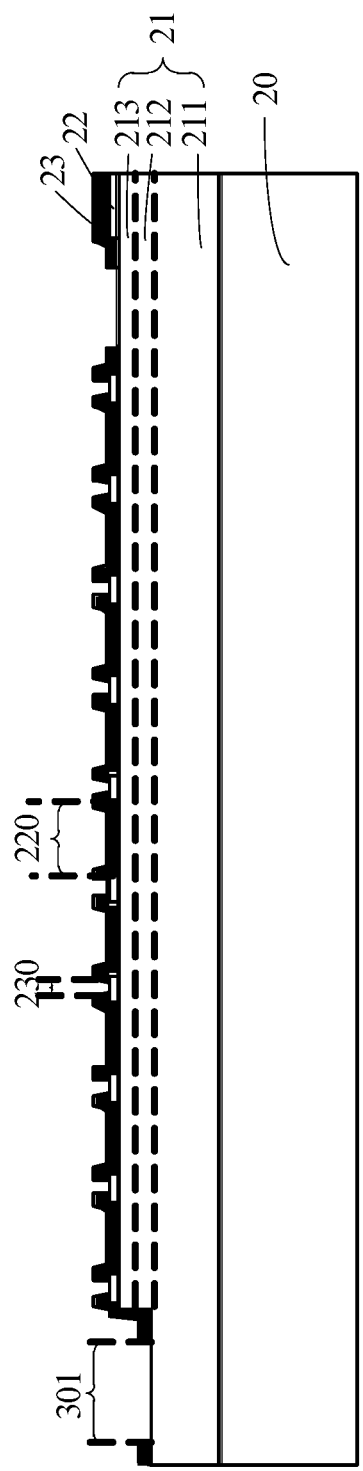
FIG. 5e schematically illustrates one or more stages of a method of manufacturing an LED chip, according to various embodiments of the present disclosure.
Figure 5F:
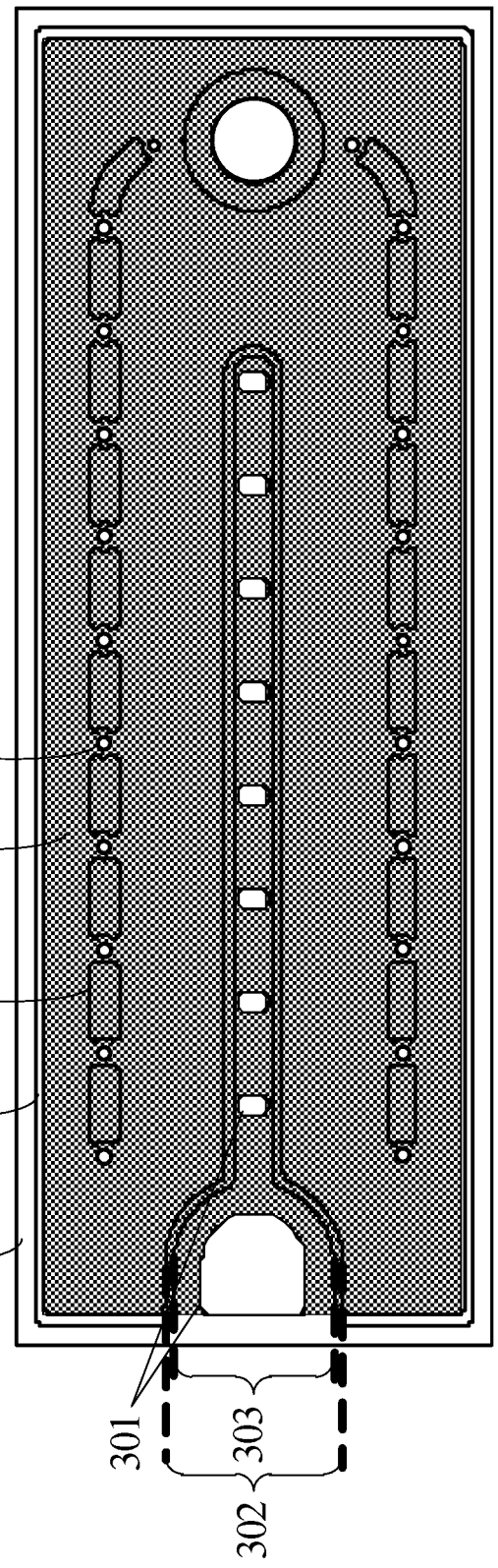
FIG. 5f schematically illustrates one or more stages of a method of manufacturing an LED chip, according to various embodiments of the present disclosure.

As shown in FIGS. 5e and 5f, a passivation protective layer 23 is formed on a surface of the transparent conducive layer 22. An etching process is performed to the passivation protective layer 23, to form one or more second through hole(s) 230 and a first sub-through hole 301. Projection(s) of the second through hole(s) 230 do not overlap with projection(s) of the first through hole(s) 220 along a direction perpendicular to the substrate 20. The second through hole(s) 230 are located within the area corresponding to the second electrode 25 to be disposed. The first sub-through hole 301 is located at the area corresponding to the first electrode 24 to be disposed.

Figure 5G:
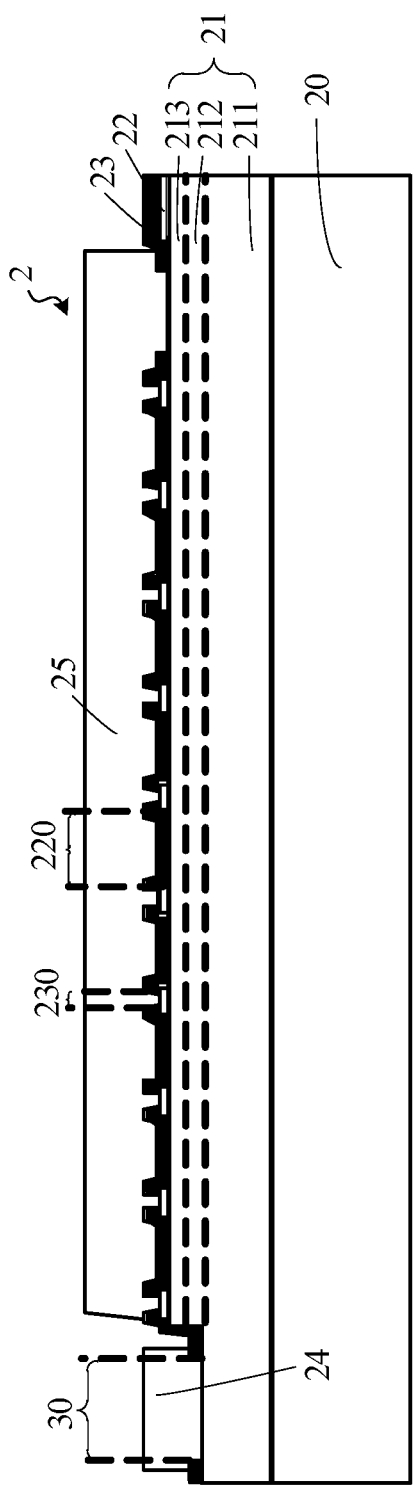
FIG. 5g schematically illustrates one or more stages of a method of manufacturing an LED chip, according to various embodiments of the present disclosure.
Figure 5H:
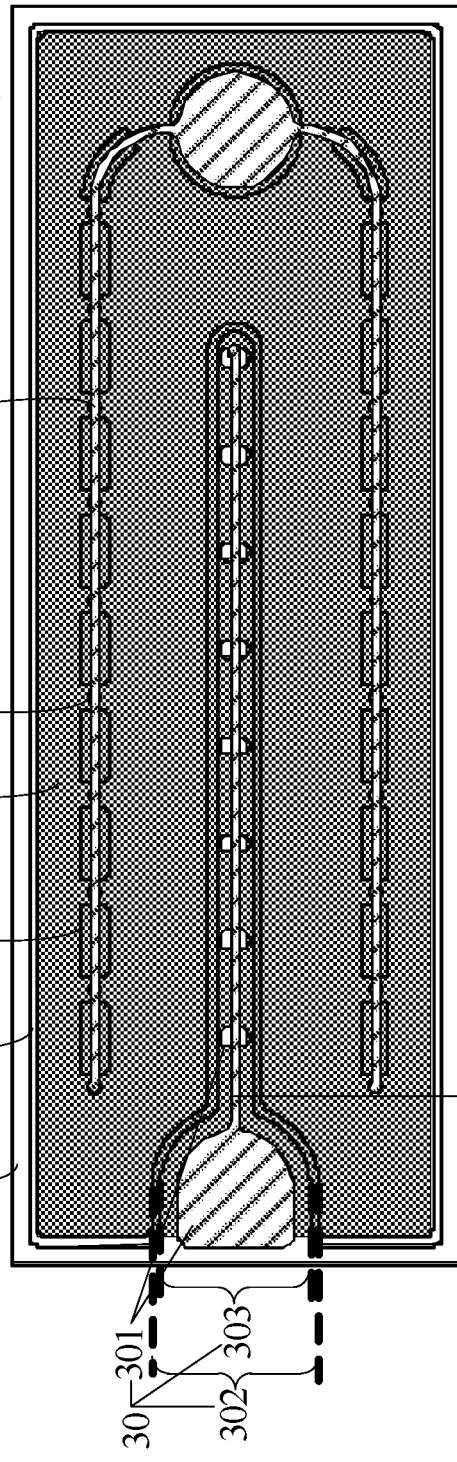
FIG. 5h schematically illustrates one or more stages of a method of manufacturing an LED chip, according to various embodiments of the present disclosure.

As shown in FIGS. 5g and 5h, an electrode layer (or multiple electrode layers) is formed on a surface of the passivation protective layer 23. An etching process is performed to the electrode layer to form the first electrode 24 and the second electrode 25. The first electrode 24 electrically connects the first semiconductor layer 211 through the third through hole 30 that extends through the passivation protective layer 23, the transparent conducive layer 22, the second semiconductor layer 213 and the quantum well luminescent layer 212. The second electrode 25 covers the first through hole(s) 220 and the second through hole(s) 230. The second electrode 25 electrically connects the second semiconductor 213 through the second through hole(s) 230 and the transparent conducive layer 22. In some embodiments, additional processes such as thinning, singulation, testing, binning, etc. may be performed to produce products of LED chips.

In some embodiments, the etching process for the epitaxial structure 21 may be preferably a physical etching process, while the etching processes for the transparent conductive layer 22 and the passivation protective layer 23 may be preferably chemical etching processes. Further, after forming an electrode layer on the surface of the passivation protective layer 23, the electrode layer may be etched to form the first electrode 24 and the second electrode 25. In other words, in some embodiments, the LED chip be fabricated using, e.g., four etching processes. The fabrication process is streamlined and does not specify an additional material or an additional etching process to form a dedicated current blocking layer. Such a fabrication process reduces the manufacturing cost of the LED chip and increases the luminous efficacy of the LED chip.

In some embodiments, the LED chip includes the second electrode that covers the first through hole(s) and the second through hole(s), and the first through hole(s) and the second through hole(s) do not overlap along the direction perpendicular to the substrate. Thus, in an area corresponding to (e.g., occupied by) the first through hole(s), a portion of the passivation protective layer between the second electrode and the second semiconductor layer may serve to block currents or electrons, to replace a dedicated current blocking layer. Such an arrangement reduces the manufacturing cost of the LED chip and improves the luminous efficacy of the LED chip. In addition, in an area corresponding to (e.g., occupied by) the second through hole(s), the second electrode may electrically connect the second semiconductor layer through the second through hole(s) and the portion of the transparent conductive layer disposed in the through hole(s). Thus, point-type light emitting may be achieved at the second through hole(s), further increasing the brightness of the LED chip.

Although various examples described and illustrated herein disclose that various layers include semiconductor materials (undoped, N-doped, or P-doped semiconductors), it is to be understood that the technology disclosed herein may be applied to chips including various types of semiconductor materials, such as gallium nitride (GaN) and/or aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A light-emitting diode (LED) chip, comprising:
a substrate;
an epitaxial structure disposed on the substrate, wherein the epitaxial structure comprises a first semiconductor layer, a quantum well luminescent layer, and a second semiconductor layer successively disposed on the substrate;
a transparent conductive layer disposed on the epitaxial structure, the transparent conductive layer defining one or more first through holes that extend through the transparent conductive layer, wherein bottom portions of the one or more first through holes are disposed immediately above a top layer of the epitaxial structure away from the substrate;
a passivation protective layer disposed on the transparent conductive layer, the passivation protective layer defining one or more second through holes that extend through the passivation protective layer, wherein along a direction perpendicular to the substrate, projections of the one or more first through holes do not overlap with projections of the one or more second through holes; and
at least one electrode disposed on the passivation protective layer, the electrode electrically connecting the transparent conductive layer through the one or more second through holes,
wherein the one or more first through holes and the one or more second through holes increase a contact area between the at least one electrode and the transparent conductive layer and improve expansion effect of a lateral current,
wherein the electrode comprises at least one linear portion, and a width of the first through holes is greater than a width of the linear portion of the electrode; and wherein the width of the first through holes and the width of the linear portion of the electrode are defined along a direction perpendicular to an extending direction of the linear portion of the electrode, and
wherein at least one of the first through holes is disposed between two adjacent ones of the second through holes, and at least one of the second through holes is disposed between two adjacent ones of the first through holes.

2. The LED chip of claim 1, wherein a portion of the passivation protective layer is disposed in the first through holes of the transparent conductive layer.

3. The LED chip of claim 2, wherein during operation, the portion of the passivation protective layer disposed in the first through holes avoid recombination of electron hole pairs underneath the electrode and the portion of the passivation protective layer.

4. The LED chip of claim 1, wherein a portion of the passivation protective layer between the at least one electrode and a semiconductor layer included in the epitaxial structure serves to block currents or electrons; and
wherein the at least one electrode electrically connects to the semiconductor layer to generate point-type light at the one or more second through holes.

5. The LED chip of claim 1, wherein the first through holes are underneath the electrode along a direction perpendicular to the substrate.

6. The LED chip of claim 1, wherein the electrode covers at least portions of the first through holes and at least portions of the second through holes.

7. The LED chip of claim 1, wherein the electrode electrically connects the second semiconductor layer through the first through holes, the second through holes and the transparent conductive layer.

8. The LED chip of claim 1, wherein the passivation protective layer, the second semiconductor layer and the quantum well luminescent layer define at least one third through hole.

9. The LED chip of claim 8, further comprising: an opposite electrode contacting and electrically connecting the first semiconductor layer through the third through hole.

10. The LED chip of claim 1, wherein the electrode electrically connects the epitaxial structure through the one or more second through holes and the transparent conductive layer.

11. A method of manufacturing a light-emitting diode (LED) chip, comprising:
disposing an epitaxial structure on a substrate, wherein the epitaxial structure comprises a first semiconductor layer, a quantum well luminescent layer, and a second semiconductor layer;
disposing a transparent conductive layer on the epitaxial structure, the transparent conductive layer defining one or more first through holes that extend through the transparent conductive layer, wherein bottom portions of the one or more first through holes are disposed immediately above a top layer of the epitaxial structure away from the substrate;

disposing a passivation protective layer on the transparent conductive layer;

performing an etching process to the passivation protective layer to form one or more second through holes that extend through the passivation protective layer, wherein along a direction perpendicular to the substrate, projections of the one or more first through holes do not overlap with projections of the one or more second through holes; and disposing at least one electrode on the passivation protective layer, the electrode electrically connecting the transparent conductive layer through the one or more second through holes;

wherein the one or more first through holes and the one or more second through holes increase a contact area between the at least one electrode and the transparent conductive layer and improve expansion effect of a lateral current, wherein the electrode comprises at least one linear portion, and a width of the first through holes is greater than a width of the linear portion of the electrode; and wherein the width of the first through holes and the width of the linear portion of the electrode are defined along a direction perpendicular to an extending direction of the linear portion of the electrode, and wherein at least one of the first through holes is disposed between two adjacent ones of the second through holes, and at least one of the second through holes is disposed between two adjacent ones of the first through holes.

12. The method of claim 11, wherein the disposing the transparent conductive layer on the epitaxial structure further comprises:

performing an etching process to the transparent conductive layer to form the one or more first through holes that extend through the transparent conductive layer.

13. The method of claim 11, wherein the disposing the passivation protective layer on the transparent conductive layer comprises:

disposing the passivation protective layer on the transparent conductive layer, wherein a portion of the passivation protective layer is disposed in the one or more first through holes that extend through the transparent conductive layer.

14. The method of claim 11, wherein the disposing the epitaxial structure on the substrate comprises:

disposing the first semiconductor layer on the substrate;

disposing the quantum well luminescent layer on the first semiconductor layer; and disposing the second semiconductor layer on the quantum well luminescent layer.

15. The method of claim 14, wherein the disposing the electrode on the passivation protective layer comprises:

disposing an electrode layer on the passivation protective layer; and performing an etching process to the electrode layer such that after the etching process, the electrode remains electrically connecting the second semiconductor layer through the one or more second through holes and the transparent conductive layer.

16. The method of claim 14, further comprising:

forming a third through hole by etching away at least a portion of the second semiconductor layer and at least a portion of the quantum well luminescent layer; and disposing an opposite electrode contacting and electrically connecting the first semiconductor layer through the third through hole.

17. A semiconductor device, comprising:

a substrate;

an epitaxial structure disposed on the substrate, the epitaxial structure including a first semiconductor layer, a quantum well luminescent layer, and a second semiconductor layer successively disposed on the substrate;

a transparent conductive layer disposed on the epitaxial structure, the transparent conductive layer defining one or more first through holes that extend through the transparent conductive layer, wherein bottom portions of the one or more first through holes are disposed immediately above a top layer of the epitaxial structure away from the substrate;

a passivation protective layer disposed on the transparent conductive layer, the passivation protective layer including a portion that fills in the first through holes of the transparent conductive layer, the passivation protective layer defining one or more second through holes that extend through the passivation protective layer, wherein along a direction perpendicular to the substrate, projections of the first through holes do not overlap with projections of the second through holes; and at least one electrode disposed on the passivation protective layer, the electrode electrically connecting the second semiconductor layer through the one or more second through holes and the transparent conductive layer;

wherein the one or more first through holes and the one or more second through holes increase a contact area between the at least one electrode and the transparent conductive layer and improve expansion effect of a lateral current, wherein the electrode comprises at least one linear portion, and a width of the first through holes is greater than a width of the linear portion of the electrode; and wherein the width of the first through holes and the width of the linear portion of the electrode are defined along a direction perpendicular to an extending direction of the linear portion of the electrode, and wherein at least one of the first through holes is disposed between two adjacent ones of the second through holes, and at least one of the second through holes is disposed between two adjacent ones of the first through holes.

* * * * *